United States Patent
Jeong et al.

(10) Patent No.: US 11,177,784 B2
(45) Date of Patent: Nov. 16, 2021

(54) METHOD AND APPARATUS FOR COMPENSATING POWER AMPLIFIER PERFORMANCE

(71) Applicant: KMW INC., Hwaseong-si (KR)

(72) Inventors: BaeMook Jeong, Hwaseong-si (KR); HyeRyeon Kim, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 16/847,620

(22) Filed: Apr. 13, 2020

(65) Prior Publication Data

US 2020/0244235 A1    Jul. 30, 2020

Related U.S. Application Data

(63) Continuation of application No. PCT/KR2018/011846, filed on Oct. 8, 2018.

(30) Foreign Application Priority Data

Oct. 17, 2017  (KR) .......................... 10-2017-0134679

(51) Int. Cl.
- *H03G 3/20* (2006.01)
- *H03F 3/21* (2006.01)
- *H03F 3/195* (2006.01)
- *H03F 3/24* (2006.01)

(52) U.S. Cl.
CPC ............. *H03F 3/211* (2013.01); *H03F 3/195* (2013.01); *H03F 3/245* (2013.01); *H03F 2200/123* (2013.01); *H03F 2200/15* (2013.01); *H03F 2200/375* (2013.01); *H03F 2200/447* (2013.01)

(58) Field of Classification Search
CPC ........................................................ H03G 3/20
USPC .................................................. 330/129, 136
See application file for complete search history.

(56) References Cited

U.S. PATENT DOCUMENTS

| | | | |
|---|---|---|---|
| 5,249,201 A * | 9/1993 | Posner ................. | H03F 1/3241 332/106 |
| 7,224,215 B2 | 5/2007 | Osborn | |
| 7,912,139 B2 | 3/2011 | Kodama | |
| 9,385,762 B2 * | 7/2016 | Laporte .................... | H03F 1/34 |

(Continued)

FOREIGN PATENT DOCUMENTS

| | | |
|---|---|---|
| JP | 2000-312120 A | 11/2000 |
| JP | 2009-225363 A | 10/2009 |
| JP | 2010-011370 A | 1/2010 |

(Continued)

OTHER PUBLICATIONS

International Search Report for PCT/KR2018/011846 dated Mar. 11, 2019 and its English translation.

(Continued)

*Primary Examiner* — Henry Choe
(74) *Attorney, Agent, or Firm* — Seung Ho Lee

(57) ABSTRACT

The present disclosure in some embodiments relates to a method of calibrating a power amplifier performance and an apparatus therefor, which provide an optimal calibration of the output characteristics of a power amplifier to all possible combinations in the input signal source by enabling individualized calibrations for changes in the output characteristics at room temperature and changing temperatures, thereby improving the performance of the power amplifier.

10 Claims, 12 Drawing Sheets

(56) References Cited

U.S. PATENT DOCUMENTS

2003/0086507 A1* 5/2003 Kim .................... H04L 27/2624
375/297

FOREIGN PATENT DOCUMENTS

KR  10-2002-0068441 A  8/2002
KR  10-2007-0015719 A  2/2007

OTHER PUBLICATIONS

Sen, Shreyas et al., "Environment-Adaptive Concurrent Companding and Bias Control for Efficient Power-Amplifier Operation", IEEE Transactions On Circuits and Systems, 03, 2011, vol. 58, pp. 607-618.
An office action dated Feb. 24, 2021 for Japanese Application No. 2020-537122 and its English translation.

* cited by examiner

FIG. 3

| Input Signal | X(Gate bias) | Y(Drain bias) |
|---|---|---|
| A | X | Y |
| B | $X \pm \triangle Va$ | $Y \pm \triangle Va'$ |
| C | $X \pm \triangle Vb$ | $Y \pm \triangle Vb'$ |
| D | $X \pm \triangle Vc$ | $Y \pm \triangle Vc'$ |
| N | $X \pm \triangle Vn$ | $Y \pm \triangle Vn'$ |

*FIG. 4B*

METHOD AND APPARATUS FOR COMPENSATING POWER AMPLIFIER PERFORMANCE

CROSS-REFERENCE TO RELATED APPLICATIONS

This application is a continuation application of International Application No. PCT/KR2018/011846, filed on Oct. 8, 2018, which claims priority and benefits of Korean Application No. 10-2017-0134679, filed on Oct. 17, 2017, the content of which is incorporated herein by reference in their entirety.

TECHNICAL FIELD

The present disclosure in some embodiments relates to a method of calibrating a power amplifier performance and an apparatus therefor. More particularly, the present disclosure relates to a method of adaptively calibrating the performance of a power amplifier according to a combination of carrier frequencies of an input signal and an apparatus therefor.

BACKGROUND

The statements in this section merely provide background information related to the present disclosure and do not necessarily constitute prior art.

A significant specification among the standards of the mobile communication equipment is for regulating distorted components not to be greater than a certain level within the operating frequency at which an Adjacent Channel Leakage Ratio (ACLR) is measured.

It is typical for a mobile communication system to have a power amplifier that produces a radio frequency (RF) output signal of a constant power level. The power amplifier may be operated by receiving a gate bias in order to receive a particular voltage and a particular current. On the other hand, a change in the gate bias provided to the power amplifier will change the output characteristics of the power amplifier, for example, the ACLR characteristics thereof.

Conventionally, responsive to whether a modulated signal source is a combination of a single component, i.e., a single carrier or another combination of multiple carriers, the power amplifier exhibits distinct output characteristics to each different multiple-carrier signal source, and accordingly, at the same bias, a singular method of compensating power amplifier performance has been unable to universally satisfy the characteristics of all possible combinations in the signal source. In order to solve this issue, a conventional calibration method utilizes an average value of the characteristics of combinations in all involved signal sources.

In addition, the degree of change of the output characteristics of the power amplifier according to the temperature change may vary by each temperature section. In other words, in terms of the variation of the output characteristics of the power amplifier according to the temperature change, the temperature section spanning from a low temperature to the room temperature may make a difference from the temperature section between the room temperature and a high temperature. This will limit the temperature compensation range of the power amplifier. To compensate for this limitation, a power amplifier has been arranged to provide a temperature-insensitive voltage or current, resulting in temperature-insensitive output characteristics of the power amplifier.

However, the conventional output characteristic compensation methods described above may work fine with a single-component signal source, except that they suffer from limitation with different multiple-component signal sources formed of different combinations wherein a temperature compensation for the output characteristics due to temperatures of each signal source is subject to application of an average compensation slope of compensations set up for the signal sources, further limiting the compensation range and limiting the ACLR characteristics.

Therefore, there is a need to introduce a technology for adaptively calibrating the output characteristics of a power amplifier to the maximum in response to all possible combinations in the input signal source while enabling individualized calibrations for changes in the output characteristics at room temperature and temperature changes.

DISCLOSURE

Technical Problem

The present disclosure in some embodiments seeks to provide an optimal calibration of the output characteristics of a power amplifier to all possible combinations in the input signal source by enabling individualized calibrations for changes in the output characteristics at room temperature and changing temperatures, thereby improving the performance of the power amplifier.

SUMMARY

At least one embodiment of the present disclosure provides an apparatus for calibrating a power amplifier performance, including a power amplifier, a collection unit, and a control unit. The power amplifier is configured to power-amplify an input signal that is sourced externally. The collection unit is configured to collect a combination information on how the input signal has carrier frequencies combined. The control unit has a look-up table storing compensation information corresponding respectively to multiple signal sources each having a different combination of carrier frequencies. The control unit is configured to adaptively control a voltage of a bias provided to at least one of a gate terminal and a drain terminal connected to the power amplifier based on the look-up table and the combination information of the input signal.

Another aspect of the present disclosure provides a method of calibrating performance of a power amplifier, including collecting a combination information on how an input signal that is sourced externally has carrier frequencies combined, and extracting compensation information corresponding to the combination information of the input signal by utilizing a look-up table storing compensation information corresponding respectively to multiple signal sources each having a different combination of carrier frequencies, and adaptively controlling a voltage of a bias provided to at least one of a gate terminal and a drain terminal connected to the power amplifier according to the compensation information extracted during the extracting.

Advantageous Effects

As described above, the present disclosure in some embodiments can provide an optimal calibration of the output characteristics of a power amplifier to all possible combinations in the input signal source by enabling individualized calibrations for changes in the output characteristics at room temperature and changing temperatures, thereby improving the performance of the power amplifier.

In addition, the present disclosure in some embodiments can set an individualized offset suitable for each signal source, based on which the designing cost and power consumption of the power amplifier can be reduced by utilizing less or lower power amplification elements for designing the power amplifier, resulting in performance improvement and miniaturization of a system using the provided power amplifier of the present disclosure.

BRIEF DESCRIPTION OF THE DRAWINGS

FIGS. 3, 4A, and 4B are diagrams for illustrating a look-up table according to some embodiments of the present disclosure.

Figure 1:
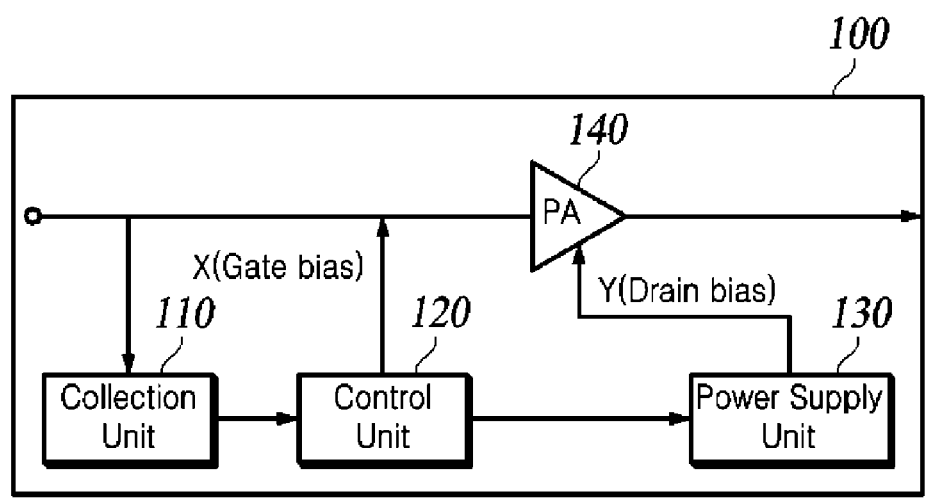
FIG. 1 is a schematic block diagram of an apparatus for calibrating power amplifier performance according to some embodiments of the present disclosure.

| REFERENCE NUMERALS | |
| --- | --- |
| 100: apparatus for calibrating power amplifier performance | |
| 110: collection unit | 120 control unit |
| 130: power supply unit | 140: power amplifier |

DETAILED DESCRIPTION

Hereinafter, some embodiments of the present disclosure will be described in detail with reference to the accompanying drawings.

The present disclosure relates to an apparatus for improving the performance of a power amplifier. More specifically, the present disclosure relates to an apparatus for calibrating the performance of a power amplifier, which enables the output characteristics of the power amplifier to be optimally calibrated in all possible combinations in the input signal source by allowing individual compensation of the output characteristics at room temperature and changing temperatures, thereby improving the performance of the power amplifier.

Referred to as a performance calibration apparatus in the following illustration, an apparatus for calibrating the performance of a power amplifier according to some embodiments of the present disclosure may be applied to various types of power amplifiers. For example, the performance calibration apparatus may be used in a structure having a power amplifier along with a linearizer, and it may also be used with a configuration involving back-off, Doherty amplifier configuration, etc. Further, the performance calibration apparatus may be used for power amplifiers having various operating classes, such as Class A, Class AB, Class C, Class F, and the like. In some embodiments of the present disclosure, the performance calibration apparatus is not limited to application to specific forms of the power amplifier.

FIG. 1 is a schematic block diagram of an apparatus for calibrating power amplifier performance or a performance calibration apparatus according to some embodiments of the present disclosure.

A performance calibration apparatus 100 includes a collection unit 110, a control unit 120, a power supply unit 130, and a power amplifier 140. In this case, the components included in the performance calibration apparatus 100 according to some embodiments are not necessarily limited to these illustrated. FIG. 1 illustrates the components for calibrating the performance of the power amplifier exclusively, and it should be appreciated that the performance calibration apparatus 100 may be configured to have more or less components or different components than those shown.

Hereinafter, the operation of each component of the performance calibration apparatus 100 according to some embodiments of the present disclosure will be described with further reference to the illustrations of FIGS. 2A through 5B.

The collection unit 110 functions to collect combination information of the carrier frequencies of an external input signal.

Meanwhile, when a demodulated signal source is a combination of multiple carriers, the carriers may have their respective frequencies combined in a variety of forms within the available frequency range. For example, when the signal source has a combination of five carrier frequencies, the respective carriers frequencies may have a form of all the respective carrier frequencies fully combined or a form of the carrier frequencies partially combined with some vacant carrier frequencies interposed. This means that the output of the power amplifier 140 has different characteristics depending on the form in which the carrier frequencies of the signal source are combined.

In this regard, the collection unit 110 collects the combination information on how the carrier frequencies of the input signal are combined (hereinafter, referred to as combination information of the input signal), and it transmits the collected combination information to the control unit 120 as reference data for calibrating the performance of the power amplifier 140.

The collection unit 110 according to some embodiments can collect the combination information of the input signal through various methods. For example, the collection unit 110 may collect the combination information of the input signal through a manner of receiving pre-identified signal source information from the upper side of the system. In another embodiment, the collection unit 110 may include a separate circuit for determining the combination information of the input signal, and may directly calculate the combination information by using the separate circuit provided.

Figure 2A:
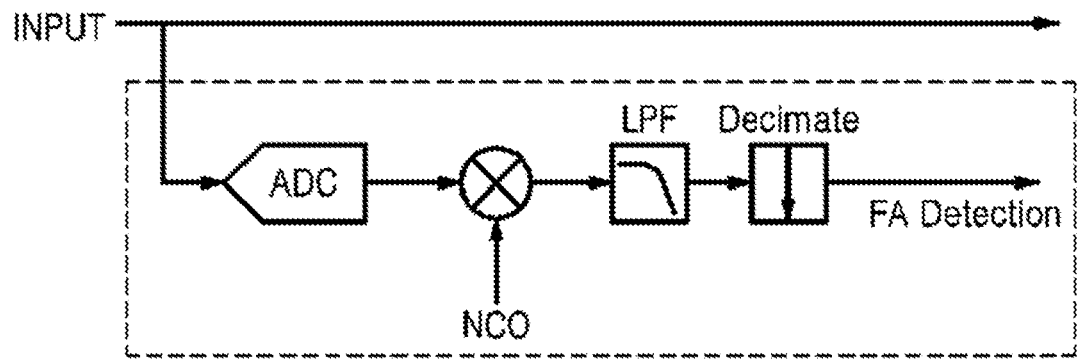
FIGS. 2A and 2B are circuit diagrams illustrating circuits for collecting combination information of input signal according to some embodiments of the present disclosure.
Figure 2B:
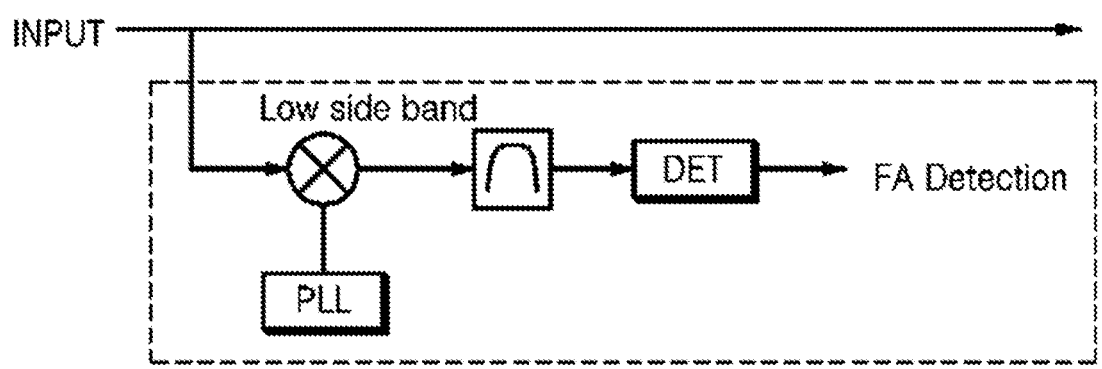

Referring now further to FIGS. 2A and 2B, a method performed by the collection unit 110 for collecting the combination information of the input signal will be illustrated. FIGS. 2A and 2B illustrate a case where the collection unit 110 includes a separate circuit for collecting the combination information of the input signal.

FIG. 2A illustrates a circuit diagram of a circuit for detecting the combination information of the input signal in a digital stage, and FIG. 2B illustrates a circuit diagram of a circuit for detecting the combination information of the input signal in an analog stage.

As shown in FIGS. 2A and 2B, the circuits may each detect the carrier frequencies of an input signal by performing a modulation process on the input signal and calculate the combination information of the carrier frequencies on the basis of the detected carrier frequencies. Each of these circuits may be provided with an input signal in RF or IF form and may be implemented as long as it does not generate a time delay of the main signal. The present disclosure does not limit the circuit for detecting the combination information of the input signal to a specific type.

The control unit 120 means an apparatus that performs adaptive performance compensation on the power amplifier 140 in real time based on the combination information on the input signal. In other words, the control unit 120 according to some embodiments performs a function of maximally calibrating the output characteristics of the power amplifier 140 in response to all possible combinations in the input signal. The control unit 120 may be a CPU.

The control unit 120 includes a look-up table storing compensation information corresponding respectively to multiple signal sources each having a different combination of carrier frequencies.

The look-up table stores the compensation information configured to enable the power amplifier 140 to generate an output with an optimum output characteristic predefined for each of the multiple signal sources. At this time, the predefined optimum output characteristic means that the output of the power amplifier 140 has its distorted components regulated not to be greater than a certain level within the operating frequency when measuring the ACLR, and in addition, changes are minimized in the performance, e.g., in the operating current of the power amplifier 140 due to temperature changes. The present disclosure does not limit the predefined optimal output characteristic to a specific characteristic.

According to the optimal output characteristic defined above, the look-up table according to some embodiments stores the compensation information corresponding to each operating temperature for each of the multiple signal sources. In particular, the look-up table stores compensation information for compensating for changes in the output characteristics of the power amplifier 140 due to temperature changes at a temperature range from a low temperature to the room temperature and at a temperature range from the room temperature to a high temperature.

Figure 3:
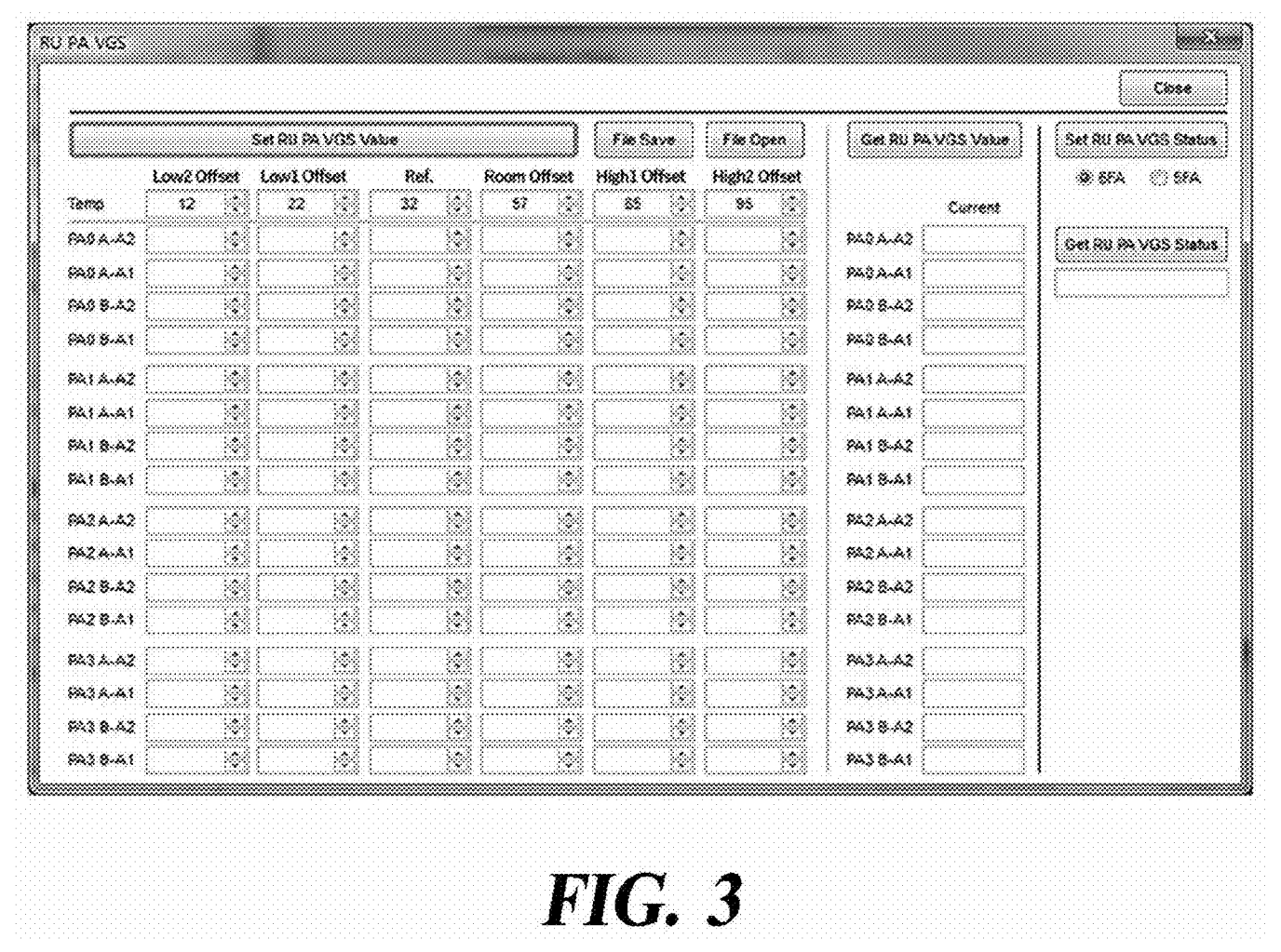
Figure 4A:
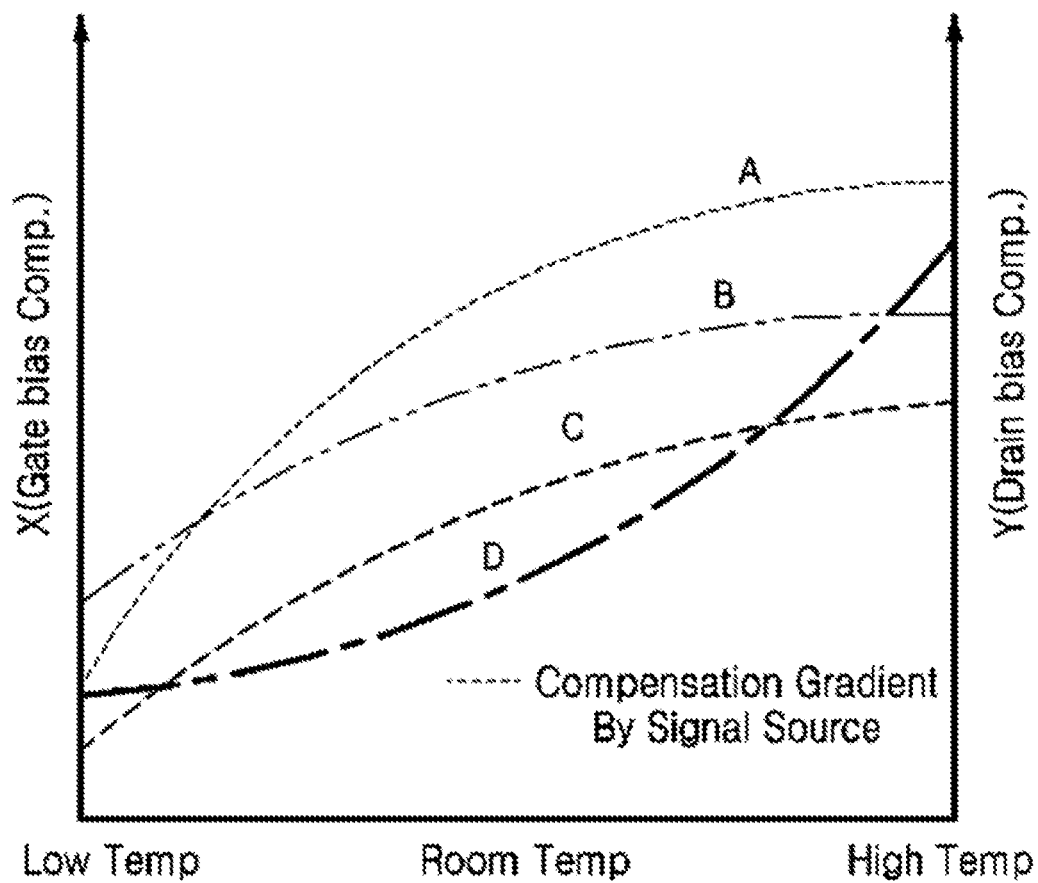

As shown in FIGS. 3, 4A and 4B, the look-up table according to some embodiments stores compensation information corresponding to each of the multiple signal sources, and the compensation information is provided differently for each operation temperature.

The compensation information stored in the look-up table according to at least one embodiment is preferably but not exclusively an offset for the bias provided to at least one of the gate terminal and the drain terminal connected to the power amplifier 140.

The control unit 120 utilizes the look-up table for extracting compensation information corresponding to the combination information of the input signal.

Based on the combination information of the input signal, the control unit 120 calculates a signal source having the same combination information as the combination information of the input signal among the multiple signal sources stored in the look-up table.

The control unit 120 calculates the compensation information matched with the calculated signal source as compensation information corresponding to the input signal. For example, the control unit 120 may retrieve compensation information corresponding to the current temperature information (=the operating temperature of the power amplifier) among the compensation information matched with the calculated signal source, and calculate the retrieved compensation information as final compensation information. To this end, the performance calibration apparatus 100 according to some embodiments further includes a temperature sensor (not shown) as a component.

The control unit 120 adaptively controls a voltage of a bias provided to at least one of the gate terminal and the drain terminal connected to the power amplifier 140 based on the calculated compensation information. To this end, the control unit 120 may generate a control signal indicating a voltage value of the bias provided to the at least one of the gate terminal and the drain terminal connected to the power amplifier 140 based on the calculated compensation information.

The control unit 120 provides a gate bias having a specific voltage value to the gate terminal based on the generated control signal. The performance calibration apparatus 100 according to some embodiments include a circuit (not shown) for providing a gate bias corresponding to the control signal of the control unit 120 to the gate terminal of the power amplifier 140.

Figure 5A:
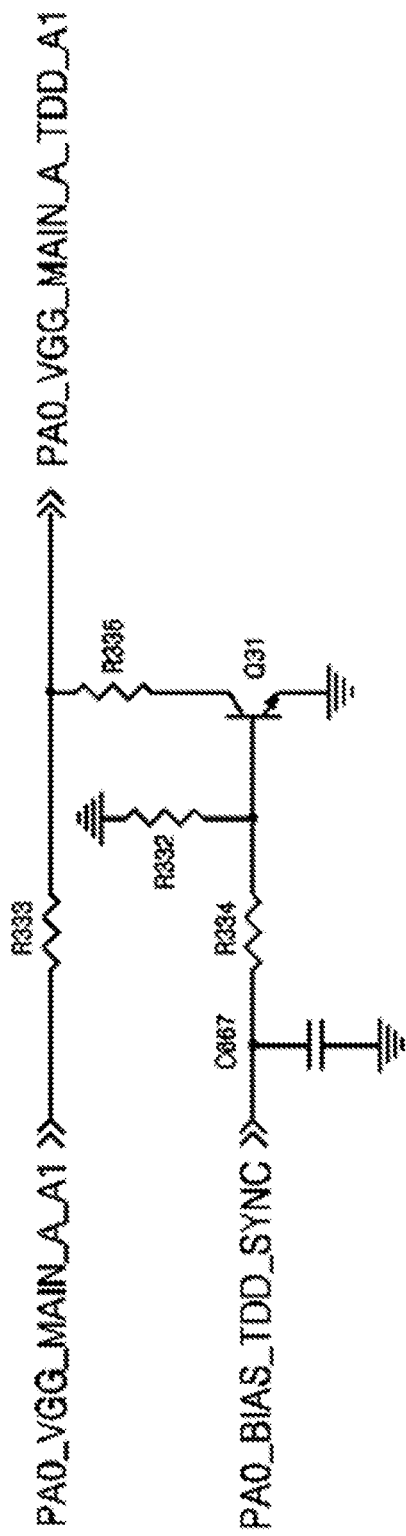
FIG. 5A and FIG. 5B are circuit diagrams of a gate-bias providing circuit and a power amplifier according to some embodiments of the present disclosure.

FIG. 5A is a diagram illustrating an example gate-bias providing circuit according to at least one embodiment of the present disclosure. The gate-bias providing circuit may be implemented as a switching transistor circuit.

As shown in FIG. 5A, the gate bias corresponding to the control signal of the control unit 120 is transmitted to the gate terminal of the power amplifier 140 through the switching transistor circuit.

On the other hand, for the bias provided to the drain terminal, the control unit 120 cannot autonomously generate a large current, and it provides the generated control signal to the power supply unit 130.

The power supply unit 130 generates a direct current (DC) voltage corresponding to the control signal and provides the generated DC voltage to the drain terminal.

The power amplifier 140 amplifies and outputs an externally sourced input signal. The power amplifier 140 according to some embodiments of the present disclosure adaptively controls a voltage of a bias provided to the at least one of the gate terminal and the drain terminal connected to the power amplifier 140 under the control of the control unit 120, thereby improving the performance of the power amplifier 140.

Therefore, with the present disclosure, the power amplifier 140 can differently adjust the voltage of the bias provided to the at least one of the gate terminal and the drain terminal connected to the power amplifier 140 according to the combination information of the input signal. The output characteristics of the power amplifier 140 can be optimally calibrated in response to all possible combinations in the input signal source, while the power amplifier 140 can be insensitive to temperature variations.

Figure 5B:
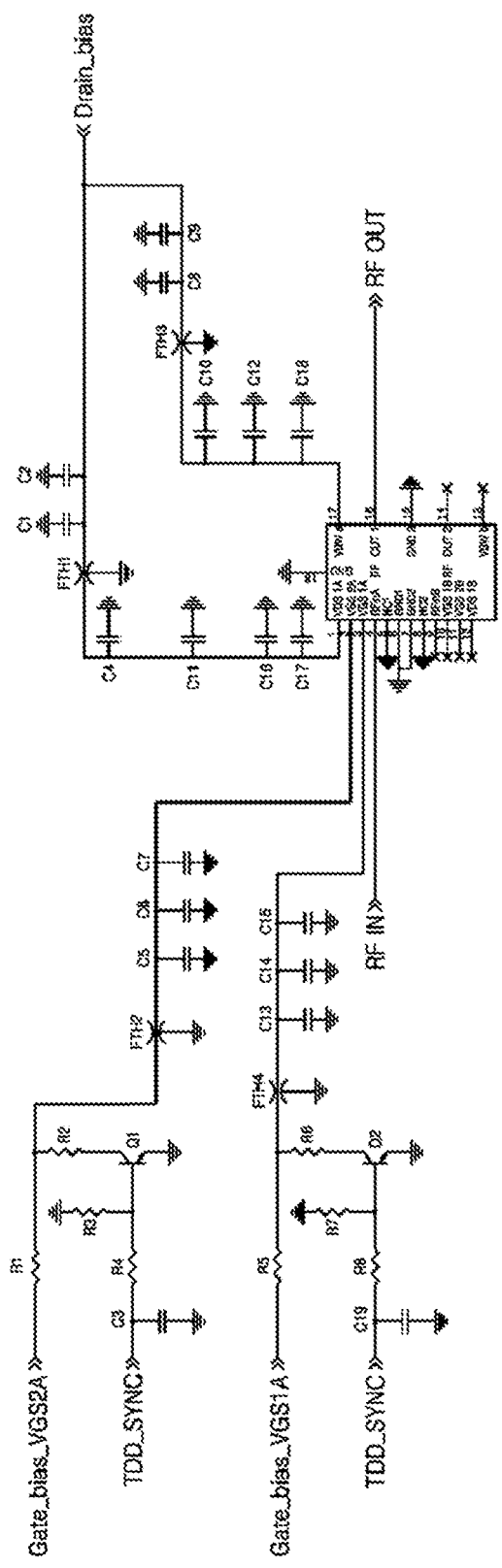

Meanwhile, FIG. 5B is an illustrative diagram of the power amplifier 140 according to at least one embodiment of the present disclosure.

As shown in FIG. 5B, the bias values determined through the control unit 120 according to some embodiments are transferred to the respective bias lines of the main transistor.

Figure 6:
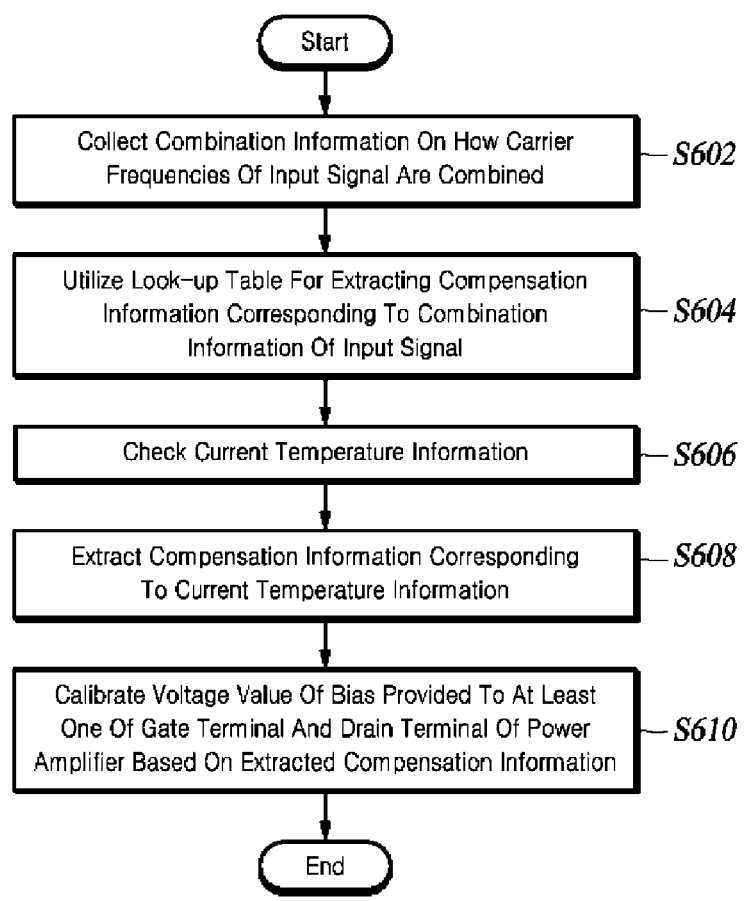
FIG. 6 is a flowchart of a method of calibrating a power amplifier performance according to some embodiments of the present disclosure.

FIG. 6 is a flowchart of a method of calibrating a power amplifier performance of according to some embodiments of the present disclosure.

The performance calibration apparatus 100 collects combination information on how the input signal has its carrier frequencies combined (S602). In Step S602, the performance calibration apparatus 100 may be provided with the collected combination information from the upper side of the system. In another embodiment, the performance calibration apparatus 100 may autonomously provide the combination information through a circuit provided in the apparatus.

The performance calibration apparatus 100 utilizes a look-up table included therein for extracting compensation information corresponding to the combination information of the input signal, which is collected in the Step S602 (S604). In Step S604, the performance calibration apparatus 100 utilizes the combination information of the input signal collected in Step S602 as a basis for searching a signal source having the same combination information as the combination information of the input signal among the multiple signal sources stored in the look-up table. Thereafter, the performance calibration apparatus 100 calculates the compensation information matched with the searched signal source as compensation information corresponding to the input signal.

The performance calibration device 100 checks the current temperature information (S606), and accordingly calculates compensation information corresponding to the current temperature information among the compensation information generated in Step S604 as final compensation information (S608).

The performance calibration apparatus 100 calibrates the voltage value of the bias provided to at least one of the gate terminal and the drain terminal connected to the power amplifier 140 based on the compensation information calculated in Step S608 (S610).

Here, since Steps S602 to S610 correspond to the operation of each component of the performance calibration apparatus 100 described above, a detailed description thereof will be omitted.

Although the steps in FIG. 6 are described to be sequentially performed, they merely instantiate the technical idea of some embodiments of the present disclosure. Therefore, a person having ordinary skill in the pertinent art could appreciate that various modifications, additions, and substitutions are possible by changing the sequences described in the drawing or by performing two or more of the steps in parallel, without departing from the gist and the nature of the embodiments of the present disclosure, and hence the steps in FIG. 6 are not limited to the illustrated chronological sequences.

As described above, the calibration method of the power amplifier performance shown in FIG. 6 can be implemented as a program and recorded in a computer-readable recording medium such as CD-ROM, RAM, ROM, memory card, hard disk, magneto-optical disk, storage device, etc.

Figure 7:
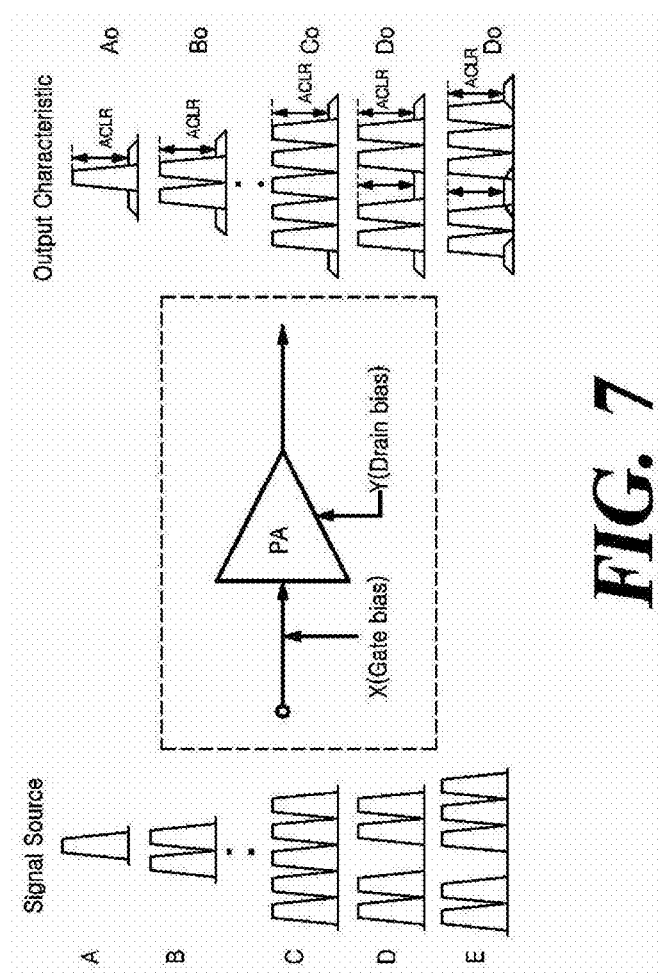
FIG. 7 is a diagram illustrating output characteristics of a power amplifier by combination in the input signal according to some embodiments of the present disclosure.

FIG. 7 is a diagram illustrating output characteristics of a power amplifier by combination in the input signal according to some embodiments of the present disclosure.

As shown in FIG. 7, where the demodulated signal source is a combination of multiple carriers, the respective carrier frequencies may be combined in various forms within the available frequency range. This means that the power amplifier 140 has different output characteristics depending on how the carrier frequencies of the signal source are combined.

With the performance calibration method by the performance calibration apparatus according to some embodiments of the present disclosure, an individualized offset suitable for each signal source can be set in response to all possible combinations in the signal source, and less or lower power amplification elements are utilized for designing the power amplifier 140. This can reduce the designing cost and power consumption of the power amplifier 140, resulting in performance improvement and miniaturization of a system using the provided power amplifier of the present disclosure.

Figure 8:
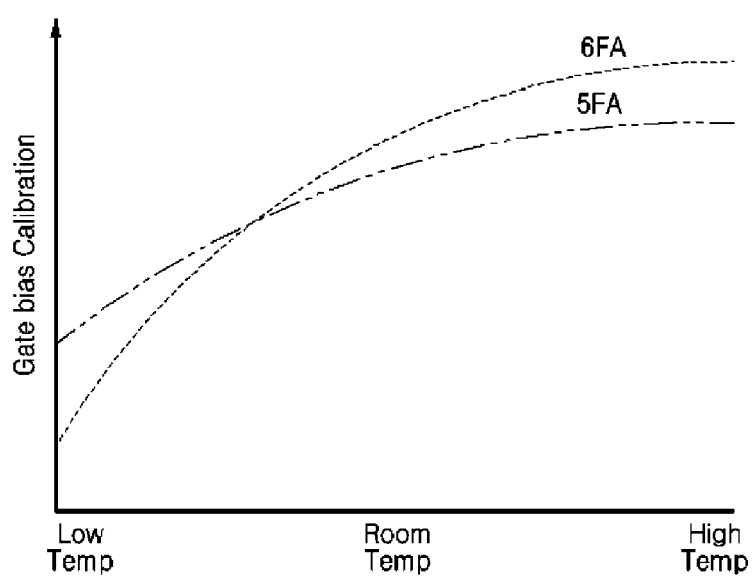
FIGS. 8, 9A, and 9B are diagrams illustrating the effect of a method of calibrating a power amplifier performance according to some embodiments of the present disclosure.
Figure 9A:
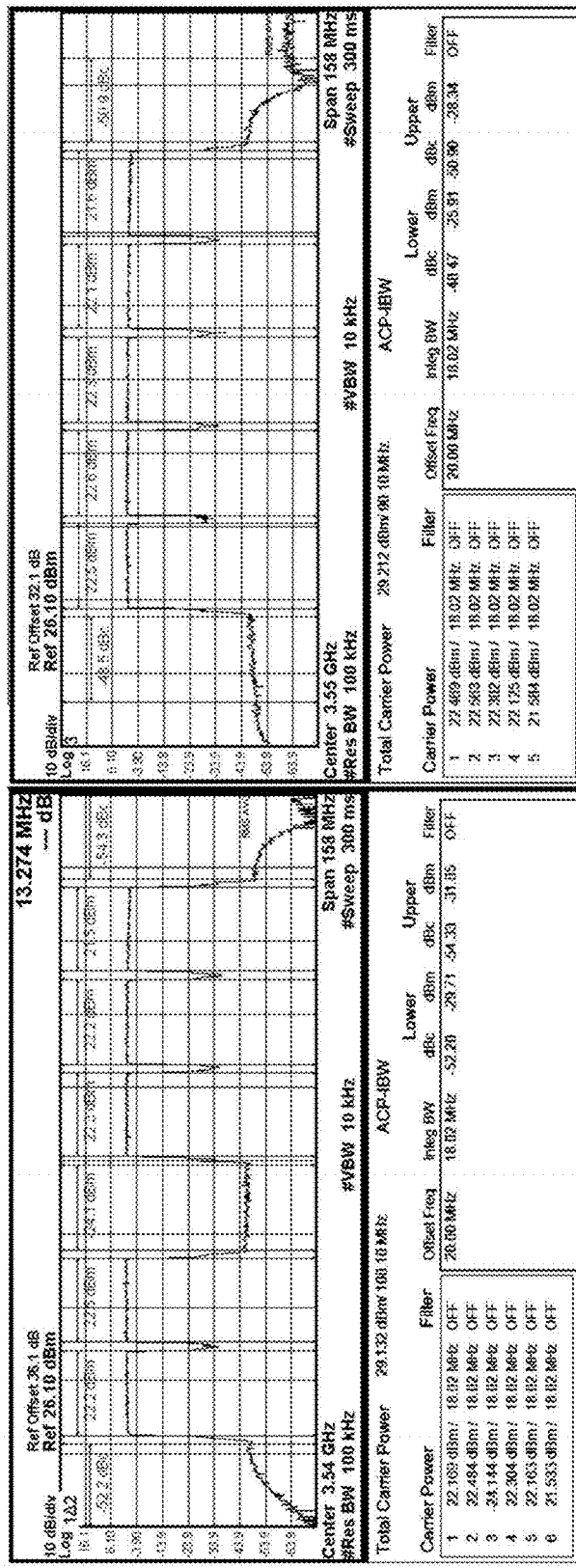
Figure 9B:
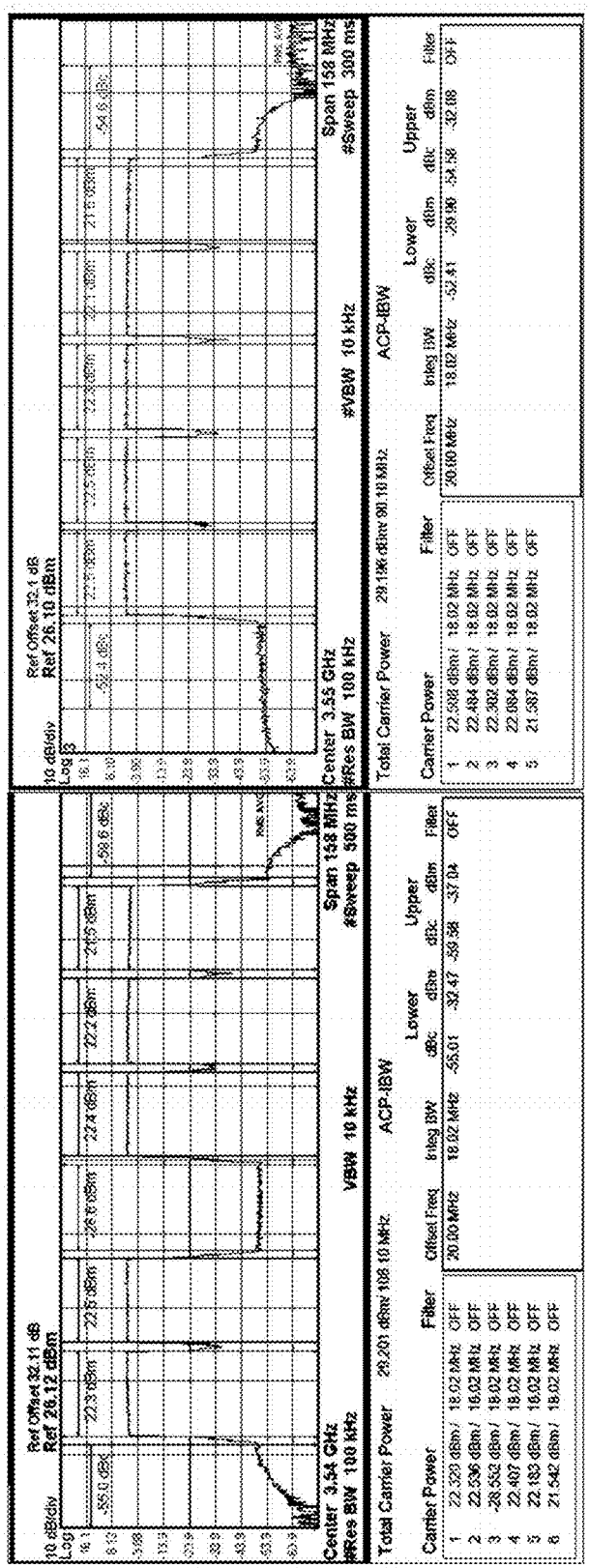

FIGS. 8, 9A, and 9B are diagrams illustrating the effect of a method of calibrating a power amplifier performance according to some embodiments of the present disclosure.

FIG. 8 is a graph illustrating offsets set for the respective signal sources having a 5FA (Frequency Assignment) source combination and a 6FA source combination due to a calibration method of a power amplifier performance according to at least one embodiment of the present disclosure.

FIGS. 9A and 9B are exemplary output characteristics of the power amplifier before and after applying the offsets of FIG. 8 to the respective signal sources. The illustrations exhibit the signal source having the 6FA source combination with the FAs filling up and with an intermediate FA left empty, while exhibiting the signal source having the 5FA source combination with the FAs filling up and with an intermediate FA left empty.

As shown in FIGS. 9A and 9B, the signal source having the 6FA source combination went up to 51 dBc from 46.4 dBc achieving an improvement of 3.6 dB, and the signal source having the 5FA source combination was improved by as much as 3.9 dB.

Although exemplary embodiments of the present disclosure have been described for illustrative purposes, those skilled in the art will appreciate that various modifications, additions and substitutions are possible, without departing from the idea and scope of the claimed disclosure. Therefore, exemplary embodiments of the present disclosure have been described for the sake of brevity and clarity. The scope of the technical idea of the present embodiments is not limited by the illustrations. Accordingly, one of ordinary skill would understand the scope of the claimed disclosure is not to be limited by the above explicitly described embodiments but by the claims and equivalents thereof.

The invention claimed is:

1. An apparatus for calibrating a power amplifier performance, comprising:
   a power amplifier configured to power-amplify an input signal that is sourced externally;
   a collection unit configured to collect a combination information on how the input signal has carrier frequencies combined; and
   a control unit having a look-up table storing compensation information corresponding respectively to multiple signal sources each having a different combination of carrier frequencies, the control unit being configured to adaptively control a voltage of a bias provided to at least one of a gate terminal and a drain terminal connected to the power amplifier based on the look-up table and the combination information of the input signal.

2. The apparatus of claim 1, wherein the look-up table stores the compensation information configured to enable the power amplifier to generate an output with an optimum output characteristic predefined for each of the multiple signal sources.

3. The apparatus of claim 2, wherein the look-up table stores the compensation information corresponding to each operating temperature for each of the multiple signal sources, and wherein the control unit controls the voltage of the bias in consideration of a current temperature information.

4. The apparatus of claim 1, wherein the compensation information comprises:
an offset for the bias provided to the at least one of the gate terminal and the drain terminal connected to the power amplifier.

5. The apparatus of claim 1, further comprising:
a power supply unit configured to generate a direct current (DC) voltage corresponding to a control signal of the control unit and to provide a generated DC voltage to the drain terminal connected to the power amplifier.

6. The apparatus of claim 1, wherein the collection unit comprises:
a separate circuit provided to determine the combination information in the collection unit, wherein
the collection unit is configured to calculate the combination information directly by using the separate circuit provided.

7. A method of calibrating performance of a power amplifier, comprising:
collecting a combination information on how an input signal that is sourced externally has carrier frequencies combined;
extracting compensation information corresponding to the combination information of the input signal by utilizing a look-up table storing compensation information corresponding respectively to multiple signal sources each having a different combination of carrier frequencies; and
adaptively controlling a voltage of a bias provided to at least one of a gate terminal and a drain terminal connected to the power amplifier according to the compensation information extracted during the extracting.

8. The method of claim 7, wherein the look-up table stores the compensation information configured to enable the power amplifier to generate an output with an optimum output characteristic predefined for each of the multiple signal sources.

9. The method of claim 8, wherein
the look-up table stores the compensation information corresponding to each operating temperature for each of the multiple signal sources, and
wherein the extracting comprises extracting the compensation information corresponding to the combination information of the input signal in consideration of a current temperature information.

10. The method of claim 8, wherein the adaptively controlling comprises:
generating a control signal indicating a voltage value of the bias provided to the at least one of the gate terminal and the drain terminal connected to the power amplifier according to the compensation information extracted during the extracting.

* * * * *